United States Patent [19]

Lehmann et al.

[11] 4,387,013

[45] Jun. 7, 1983

[54] REACTIVE SPUTTER ETCHING OF ALUMINUM

[75] Inventors: Hans W. Lehmann; Klaus Frick; Roland W. Widmer, all of Zurich, Switzerland

[73] Assignee: RCA Corporation, New York, N.Y.

[21] Appl. No.: 295,513

[22] Filed: Aug. 24, 1981

[51] Int. Cl.$^3$ ............................................ C23C 15/00
[52] U.S. Cl. ................................ 204/192 E; 204/298
[58] Field of Search ....................... 204/192 E; 62/55.5

[56] References Cited

U.S. PATENT DOCUMENTS

| | | | |
|---|---|---|---|
| 3,719,052 | 3/1973 | Whitl ..................................... | 62/55.5 |
| 3,788,096 | 1/1974 | Brilloit ................................. | 62/55.5 |
| 3,994,793 | 11/1976 | Harvilchuck et al. .............. | 204/192 |
| 4,263,730 | 5/1981 | Hirose et al. .................... | 204/192 E |

OTHER PUBLICATIONS

Vossen, et al., Thin Film Processes, Academic Press, N.Y., N.Y., 1978, pp. 340-341.
Lazarev et al., Cryogenics, 1979, pp. 499-504.
Schwenterly Proceedings of the Seventh Conf. Engineering Problems of Fusion Research, Knoxville, Tenn., Oct. 25-27, 1977.
Kirk-Othmer Encyclopedia of Chem. Technology, vol. 21, pp. 126-137, 144-145, 147-151, 155.
Hess, Plasma Etching of Aluminum, Solid State Technology, Apr. 1981, 189-194.
Donnelly et al., Anisotropic Etching in Chlorine-Containing Plasmas, Solid State Technology, Apr. 1981, 161-166.
Mizutani et al., Jap. Patent No. 80 06 407 (1980), Chem. Abstracts abstract supplied.
Schaible et al., Reactive Ion Etching of Aluminum and Aluminum Alloys in an RF Plasma Containing Halogen Species, J. Vac. Sci. Technol. 15, 334-337 (1978).
Tokunaga et al., Plasma Etching of Aluminum in Carbon Tetrachloride, Electrochem Soc. Extend. Abstract 79-2, 1527-28 (1979).
Booth et al., Application of Plasma Etching Techniques to Metal-Oxide-Semiconductor (MOS) Processing, Thin Solid Films 65, 111-123 (1980).
Meusemann, Reactive Sputter Etching and Reactive Ion Milling-Selectivity, Dimensional Control, and Reduction of MOS-Interface Degradation, J. Vac. Sci, Technol. 16, 1886-1888 (1979).
Coburn et al., Some Chemical Aspects of the Fluorocarbon Plasma Etching of Silicon and its Compounds, Solid State Technology, Apr. 1979, 117-124.
Vossen, Glow Discharge Phenomena in Plasma Etching and Plasma Deposition, J. Electrochem Soc. 126, No. 2, 319-324 (1979).
Tokunaga K., Redeker F. C., Danner D. A. and Hess D. W., Comparison of Aluminum Etch Rates in Carbon Tetrachloride and Boron Trichloride Plasmas, J. Electrochem. Soc. 128, pp. 851-855 (1981).
Mundt R., Patel K. C. and Cowen K., Etch Uniformity in a $CCl_4$ Plasma Aluminum Etch, IEEE-IEDM, pp. 409-411 (1980).

*Primary Examiner*—Arthur P. Demers
*Attorney, Agent, or Firm*—Birgit E. Morris; R. Hain Swope

[57] ABSTRACT

An improved sputter etching apparatus for etching a substrate with a reactive gas. The improvement in the apparatus comprises utilizing a cryogenic pump as the vacuum means to evacuate the plasma chamber. The improved apparatus of the invention is particularly useful for the reactive sputter etching of aluminum substrates utilizing a highly reactive gas such as boron trichloride.

3 Claims, 8 Drawing Figures

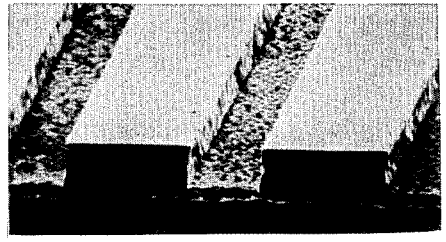
Fig. 2a
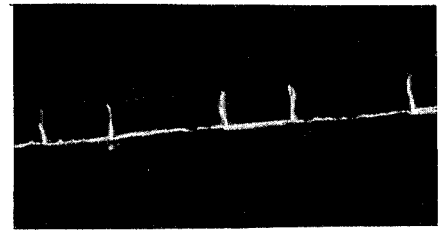
Fig. 2b
Fig. 3a
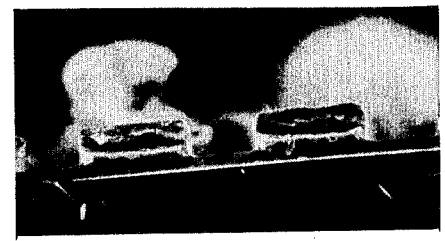
Fig. 3b
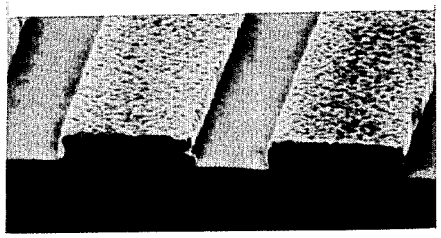
Fig. 4a
Fig. 4b  |2μm|

REACTIVE SPUTTER ETCHING OF ALUMINUM

This invention relates to the fabrication of fine patterns in certain materials by reactive sputter etching utilizing a highly reactive gas. More particularly, this invention relates to an improvement in the apparatus utilized in reactive sputter etching of aluminum which provides highly reliable and reproducible results.

BACKGROUND OF THE INVENTION

The definition of fine patterns in an aluminum film supported on a substrate is recognized as an important step in the production of silicon integrated circuit technology. It is likewise well recognized that the reproducible etching of aluminum is difficult to achieve.

Traditionally, aluminum patterns are defined by etching utilizing a photoresist as an etch mask. Wet chemical etching utilizing acids has been the predominate etching method in past years. This method is recognized as having a number of disadvantages.

Wet chemical etching of aluminum is completely isotropic, i.e., the etch proceeds in all directions at the same rate. There is also frequent loss of adhesion between portions of the photoresist and the aluminum. The former produces a reduction in line width in the aluminum with respect to the mask, and the latter causes loss of resolution in those areas where the photoresist has separated from the aluminum. Wet chemical etching is further disadvantageous in that it is expensive due to the large amount of high purity chemicals which are required. There is also the inherent hazard of handling the acid etchants and the problem of how to safely dispose of them after use.

As a result of the above disadvantages of wet chemical etching, the semiconductor industry is turning to dry etching methods, i.e., plasma etching or reactive sputter etching. In these methods, etching is carried out wholly or partially by reactive species generated in a plasma or gas discharge. The reactive species react with the aluminum to form one or more volative compounds which are pumped away with the unreacted gas by a vacuum pump. Such dry etching techniques are free from the aforementioned disadvantages involving the use, handling and disposal of highly acidic etchants. Further, such dry etching techniques are generally highly anisotropic, i.e., unidirectional, thereby producing superior line definition. However, those skilled in the art recognize that such techniques also have certain disadvantages, predominately associated with the extreme reactivity of the reactive species which etch the aluminum. The present invention is directed to alleviating the problems caused by the extreme reactivity of the reactive species.

SUMMARY OF THE INVENTION

In accordance with this invention, there is provided a means of preventing contamination of the aluminum substrate by gaseous products of reactions between the etching gas and the oils conventionally utilized in vacuum pumps by incorporating into apparatus for the reactive sputter etching of aluminum a cryogenic pump, (hereinafter cryopump).

BRIEF DESCRIPTION OF THE DRAWINGS

FIGS. 2a and 2b are sideview and frontview photomicrographs, respectively, of a photoresist pattern on an aluminum substrate before etching.

FIGS. 3a and 3b are sideview and frontview photomicrographs, respectively, of the same structure after etching of the aluminum with the apparatus of this invention.

FIGS. 4a and 4b are sideview and frontview photomicrographs, respectively, of the same structure after removal of the photoresist.

DETAILED DESCRIPTION OF THE INVENTION

Figure 1:
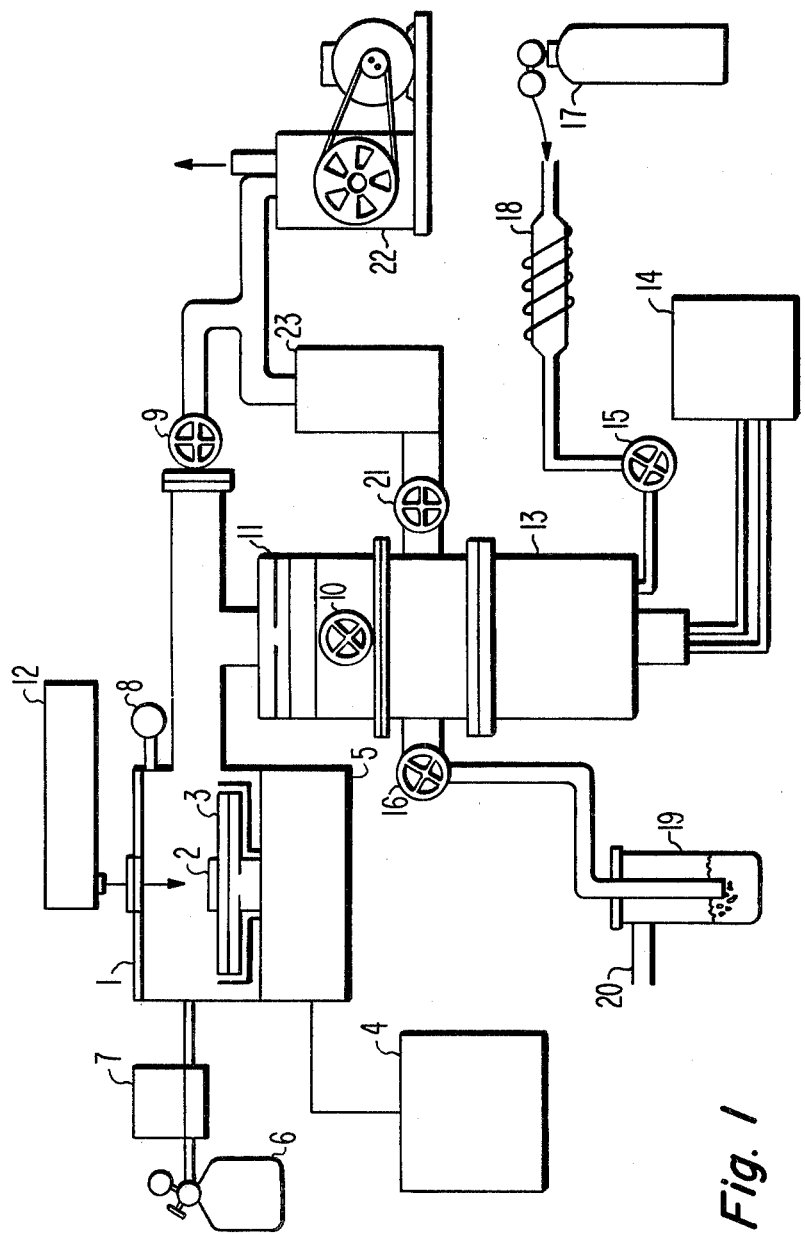
FIG. 1 is a schematic illustration of a typical apparatus for the reactive sputter etching of aluminum incorporating the improvement of this invention.

It is recognized by those skilled in the art that, in order to produce volatile aluminum compounds which can be removed from the reaction chamber, it is necessary to utilize a gas which forms chlorine atoms or chlorine-containing radicals in a plasma, for example, boron trichloride, carbon tetrachloride or silicon tetrachloride. While most of the reactive species formed in the plasma are short lived and are deactivated by collisions in the plasma or on surfaces, $BCl_3$, $CCl_4$ or reaction products of the plasma and the aluminum will get into the vacuum pump. Boron trichloride, for example, is a very powerful Lewis acid and will react with almost any organic molecule. Any reaction between these reactive species and/or the etching gas and the pump oil will form volatile by-products which can backstream into the etching chamber and adversely affect the etching process.

To prevent etch gas from entering the forepump, it is conventional to utilize a nitrogen cooled cold trap between the main vacuum system and the forepump. It is likewise conventional to utilize a diffusion pump to maintain the high vacuum and flow rates necessary for reactive sputter etching. During normal operation of such pumps, the pump oil is constantly vaporized. This means that the pump can handle only vapors and gases which do not react with its own oil.

While all modern pump oils are resistant to oxidation by oxygen and other oxidizing agents, the choice of a pump oil becomes very limited whenever more reactive gases must be exhausted from the system. The pump oil of choice for such reactive systems is a perfluoroether such as, for example, Fomblin, available from Montedison Corp. This oil is conventionally utilized, for example, in the etching of silicon substrates utilizing fluorinated gases.

It has been found in accordance with this invention that even the perfluoroether pump oils are not inert to etch gases conventionally used to etch aluminum, particularly boron trichloride and certain reactive species thereof generated in the plasma. Therefore, if the etch gas and/or certain of the reactive species thereof are allowed to come in contact with even these so-termed "inert" pump oils, the pump oils will be decomposed. Decomposition of the pump oils adversely affects the etching process by forming high vapor pressure species which can backstream into the reaction chamber and interfere directly with the etching process and by also causing an effective loss of pump speed. It is our discovery that these undesirable reactions may be prevented only by the use of a cryopump. While this invention is predicated on the discovery that the above discussed highly reactive gases will react with pump oils heretofore considered inert, it is likewise useful for any reactive sputter etching wherein the reactive gas is found to react with the pump oil to the detriment of the etching process.

While cryopumps are conventionally utilized for other applications, particularly deposition processes, to our knowledge their use in the reactive sputter etching of aluminum has heretofore not been proposed. It is probable that cryopumps have not been proposed for the reactive sputter etching of aluminum because it has not previously been appreciated that the highly reactive etch gases utilized to etch aluminum, particularly boron trichloride, and certain of their reactive species, will react with and decompose "inert" perfluoroether pump oils with adverse effect on the etching process. Through the use of a cryopump in accordance with this invention, reactive sputter etching of an aluminum substrate can be carried out efficiently and with excellent results. Those skilled in the art will appreciate that, while this invention has been described with reference to aluminum, it is equally applicable to the reactive sputter etching of other materials which can be etched only with such reactive gases.

An illustrative apparatus for the reactive sputter etching of an aluminum substrate including a cryopump in accordance with this invention is shown schematically in FIG. 1. In FIG. 1, the etching of aluminum is carried out in a sputter reaction chamber 1. The aluminum substrate 2 is exposed on platform 3 which is preferably formed of quartz. The rf-voltage supplied by generator 4 is coupled to the substrate platform 3 by tuning network 5. The gas, e.g. boron trichloride, is fed to the reaction chamber 1 from reservoir 6 through mass flow meter 7. The pressure in the chamber is monitored by a capacitance manometer 8.

In operation, valve 9 is opened and the system pumped out to a pressure of about 0.2 Torr. Valve 9 is then closed, main gate valve 10 opened and the system evacuated to a pressure of $10^{-6}$ Torr. Boron trichloride is then admitted to the system at a given flow rate through mass flowmeter 7. The desired pressure is maintained by reducing the opening of the iris valve 11 in the pumping line. The plasma in the chamber 1 is ignited by turning on the rf voltage. Etching of the substrate 2 is continued until the endpoint is reached, as determined by an optical endpoint detector 12 which monitors the emitted light intensity of the reaction product, aluminum chloride. The boron trichloride is then turned off, main gate valve 10 is closed, the system vented and the etched substrate 2 removed.

During the etching operation, the cryopump 13 continuously removes reaction products from the chamber 1. The temperature inside the cryopump is maintained very low, typically 10°–12° Kelvin, by closed-loop helium refrigeration from compressor 14. At such low temperatures most gases condense out in the solid state.

When the cryopump 13 has reached its capacity, main gate valve 10 is closed and the helium compressor 14 is shut off. As the cryopump 13 gradually warms, the condensed products again volatilize. As the cryopump 13 is warming, valves 15 and 16 are opened and the cryopump is flushed with nitrogen gas from reservoir 17 which is warmed by passage through heater 18. The products are passed through a scrubber 19 and vented to the atmosphere through vent 20.

After the cryopump 13 has reached ambient temperature, valves 15 and 16 are closed. Valve 21 is then opened and the cryopump 13 again evacuated to a pressure of between about 0.1 and 0.5 Torr by forepump 22. A molecular sieve 23 is interposed between the forepump 22 and cryopump 13 to prevent forepump oil from backstreaming into the cryopump 13. During the evacuation of the cryopump, compressor 14 is again activated. When the cryopump has reached the desired temperature and pressure, forepump 22 is turned off and valve 21 is closed. The system is then fully regenerated and operational.

FIGS. 2a and 2b show a typical photoresist pattern on aluminum over a silicon dioxide base. The photoresist, Shipley Company's AZ1350, has been irradiated and developed, thereby exposing portions of the aluminum surface.

FIGS. 3a and 3b show the same structure after reactive sputter etching in a boron trichloride plasma in conventional apparatus modified to include a cryopump in accordance with this invention.

FIGS. 4a and 4b show the same structure after removal of the remaining photoresist. The efficiency of the etching procedure is readily apparent from the smooth photoresist surfaces seen in FIGS. 3a and 3b and the absolutely clean silicon dioxide surface seen in FIGS. 4a and 4b.

Figure 5:
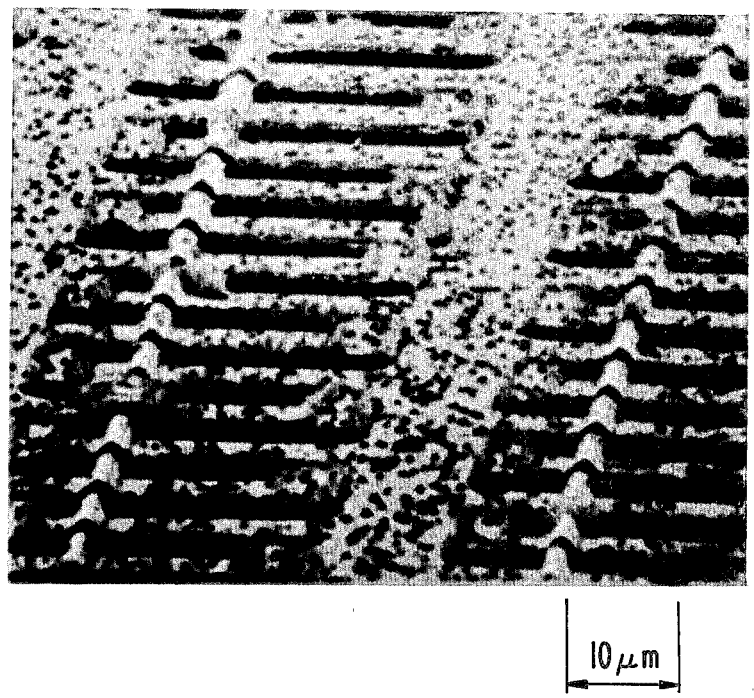
FIG. 5 is a photomicrograph of an aluminum substrate etched in a diffusion pump system.

FIG. 5 is a photomicrograph of a similar structure etched under identical conditions except that a conventional diffusion pump was utilized in the apparatus. The photoresist is still in place. The pump oil was the perfluoroether Fomblin. Contamination on the surface due to condensation of reaction products of the pump oil with boron trichloride is clearly visible.

It is to be noted that the terms "aluminum" and "aluminum substrate" as utilized herein refer to a material, for example silicon dioxide, having a layer of aluminum overlying a surface thereof. The substrate may have more than one layer of one or more substances with aluminum as an overlying layer.

As previously stated, it is preferred that the substrate platform utilized in the reactive sputter etching of an aluminum substrate in accordance with this invention be made of quartz. Although various materials are known to be useful for substrate platforms, few have been utilized for reactive sputter etching of aluminum substrates because of the stringent criteria imposed by the highly reactive gases used for such etching.

Quartz is preferred because it is inert to such gases and their reactive species, is non-porous and will not cause back-sputtering as is the case with some materials conventionally used in substrate platforms. Therefore, in accordance with this invention, the use of a quartz substrate platform in combination with a cryopump produces excellent results in reactive sputter etching of aluminum. The photomicrographs in FIGS. 3a, 3b, 4a and 4b clearly demonstrate the superior results obtainable utilizing our improvements.

We claim:

1. In a process for the reactive sputter etching of a substrate with a reactive gas comprising: placing said substrate in a suitable plasma chamber; introducing said reactive gas into said chamber under reduced pressure; generating a plasma discharge in said chamber thereby etching the substrate; and maintaining a high vacuum in said chamber with vacuum pump means thereby continuously removing volatile products of the etching process, the improvement comprising utilizing a cryogenic pump to maintain the high vacuum, thereby improving the reproducibility of the etch being a cryogenic pump.

2. A process according to claim 1, wherein the substrate to be etched comprises a layer of aluminum.

3. A process according to claims 1 or 2, wherein said reactive gas is boron trichloride.

* * * * *

UNITED STATES PATENT AND TRADEMARK OFFICE
CERTIFICATE OF CORRECTION

PATENT NO. : 4,387,013

DATED : June 7, 1983

INVENTOR(S) : Hans W. Lehmann, Klaus Frick, Roland W. Widmer

It is certified that error appears in the above-identified patent and that said Letters Patent is hereby corrected as shown below:

Column 4, line 63 delete "being a cryogenic pump".

Signed and Sealed this

Second Day of August 1983

[SEAL]

Attest:

GERALD J. MOSSINGHOFF

Attesting Officer

Commissioner of Patents and Trademarks